(12) United States Patent
Gandikota et al.

(10) Patent No.: US 11,961,734 B2
(45) Date of Patent: *Apr. 16, 2024

(54) TREATMENTS TO ENHANCE MATERIAL STRUCTURES

(71) Applicant: Applied Materials, Inc., Santa Clara, CA (US)

(72) Inventors: Srinivas Gandikota, Santa Clara, CA (US); Yixiong Yang, San Jose, CA (US); Jacqueline Samantha Wrench, Santa Clara, CA (US); Yong Yang, Mountain View, CA (US); Steven C. H. Hung, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/729,643

(22) Filed: Apr. 26, 2022

(65) Prior Publication Data
US 2022/0262629 A1    Aug. 18, 2022

Related U.S. Application Data

(63) Continuation of application No. 16/951,858, filed on Nov. 18, 2020, now Pat. No. 11,417,517, which is a
(Continued)

(51) Int. Cl.
*H01L 21/02*    (2006.01)
*H01L 21/28*    (2006.01)
*H01L 21/67*    (2006.01)

(52) U.S. Cl.
CPC .. *H01L 21/02247* (2013.01); *H01L 21/02043* (2013.01); *H01L 21/02274* (2013.01);
(Continued)

(58) Field of Classification Search
CPC ......... H01L 21/02247; H01L 21/02043; H01L 21/02274; H01L 21/28185;
(Continued)

(56) References Cited

U.S. PATENT DOCUMENTS 6,348,420 B1   2/2002  Raaijmakers et al.
6,617,639 B1   9/2003  Wang
(Continued)

FOREIGN PATENT DOCUMENTS

KR   10-2003-0043256 A   6/2003
KR   10-2003-0053318 A   6/2003
(Continued)

OTHER PUBLICATIONS

Hasan, MD. Mehedi, "Work Function Tuning in Sub-20nm Titanium Nitride (TiN) Metal Gate: Mechanism and Engineering," King Abdullah University of Science andTechnology, Thuwal, Kingdom of Saudi Arabia, Jul. 2011, 68 bages.
(Continued)

*Primary Examiner* — Mohammed Shamsuzzaman
(74) *Attorney, Agent, or Firm* — Patterson + Sheridan, LLP

(57) ABSTRACT

A method of forming a high-κ dielectric cap layer on a semiconductor structure formed on a substrate includes depositing the high-κ dielectric cap layer on the semiconductor structure, depositing a sacrificial silicon cap layer on the high-κ dielectric cap layer, performing a post cap anneal process to harden and densify the as-deposited high-κ dielectric cap layer, and removing the sacrificial silicon cap layer.

10 Claims, 6 Drawing Sheets

Related U.S. Application Data continuation-in-part of application No. 16/403,312, filed on May 3, 2019, now Pat. No. 10,872,763.

(52) U.S. Cl.
CPC .. *H01L 21/28185* (2013.01); *H01L 21/28202* (2013.01); *H01L 21/67023* (2013.01); *H01L 21/67207* (2013.01)

(58) Field of Classification Search
CPC ......... H01L 21/28202; H01L 21/67023; H01L 21/67207; H01L 21/0228; H01L 21/02312; H01L 21/02323; H01L 21/02332; H01L 21/02337; H01L 21/0234; H01L 21/28194; H01L 21/28229; H01L 21/67184; H01L 21/67201; H01L 29/4966; H01L 29/513; H01L 29/517; H01L 29/518; H01L 21/02181

See application file for complete search history.

(56) References Cited

U.S. PATENT DOCUMENTS

| | | | |
|---|---|---|---|
| 6,627,503 | B2 | 9/2003 | Ma et al. |
| 6,723,581 | B1 | 4/2004 | Chabal et al. |
| 6,806,145 | B2 | 10/2004 | Haukka et al. |
| 6,821,873 | B2 | 11/2004 | Visokay et al. |
| 6,921,702 | B2 | 7/2005 | Ahn et al. |
| 6,953,721 | B2 | 10/2005 | Agarwal |
| 6,956,267 | B2 | 10/2005 | Hattangady |
| 7,084,078 | B2 | 8/2006 | Ahn et al. |
| 7,700,988 | B2 | 4/2010 | Lin et al. |
| 8,404,544 | B1* | 3/2013 | Yin ................. H01L 21/823857 257/E21.409 |
| 8,420,208 | B2 | 4/2013 | Huang et al. |
| 8,778,816 | B2 | 7/2014 | Sato et al. |
| 10,347,492 | B2 | 7/2019 | Hung et al. |
| 10,872,763 | B2 | 12/2020 | Chu et al. |
| 2005/0124121 | A1 | 6/2005 | Rotondaro et al. |
| 2006/0051880 | A1* | 3/2006 | Doczy ................. H01L 21/0214 438/257 |
| 2006/0051882 | A1* | 3/2006 | Doczy ............... H01L 21/28176 438/257 |
| 2008/0070395 | A1 | 3/2008 | Yen et al. |
| 2008/0076216 | A1* | 3/2008 | Pae ................... H01L 29/66545 438/257 |
| 2010/0102376 | A1 | 4/2010 | Ma et al. |
| 2010/0239758 | A1 | 9/2010 | Kher et al. |
| 2011/0086504 | A1* | 4/2011 | Huang ............. H01L 21/02071 257/E21.294 |
| 2011/0124172 | A1 | 5/2011 | Jeong et al. |
| 2011/0207314 | A1 | 8/2011 | Niimi et al. |
| 2012/0088356 | A1 | 4/2012 | Santhanam et al. |
| 2012/0329285 | A1 | 12/2012 | Wang et al. |
| 2013/0270655 | A1* | 10/2013 | Adam ..................... H01L 21/20 257/E21.409 |
| 2013/0277766 | A1* | 10/2013 | Kelwing ......... H01L 21/823857 257/E21.177 |
| 2014/0070332 | A1* | 3/2014 | Adam ............... H01L 29/66545 438/300 |
| 2014/0099785 | A1* | 4/2014 | Mujumdar ........ H01L 21/28185 438/591 |
| 2014/0179093 | A1* | 6/2014 | Choi ................. H01L 29/66553 438/589 |
| 2015/0255294 | A1* | 9/2015 | Leobandung ......... H01L 29/517 257/410 |
| 2016/0005832 | A1 | 1/2016 | Chang et al. |
| 2016/0013313 | A1* | 1/2016 | Cheng ................. H01L 29/0847 257/408 |
| 2018/0174848 | A1 | 6/2018 | Wen |
| 2018/0218911 | A1 | 8/2018 | Hung et al. |
| 2019/0139759 | A1* | 5/2019 | Cheng ............... H01L 21/02321 |
| 2019/0287805 | A1 | 9/2019 | Hung et al. |
| 2020/0098640 | A1 | 3/2020 | Savant et al. |
| 2020/0168507 | A1* | 5/2020 | Chang ............... H01L 21/76832 |
| 2020/0357911 | A1* | 11/2020 | Frougier ........... H01L 29/42392 |

FOREIGN PATENT DOCUMENTS

| | | |
|---|---|---|
| KR | 10-2009-0014139 A | 2/2009 |
| TW | 202013506 A | 4/2020 |

OTHER PUBLICATIONS

Filliot, F. et al., "Study of metal gate work function modulation using plasma and SiH4 treated TiN thin films," Article, Mat. Res. Soc. Symp. Proc. vol. 786, 2004, Accessed Online https://www.researchgate.net/publication/232003039, 8 pages.

"Electron Work Function of the Elements", https://public.wsu.edu/pchemlab/documents/Workunctionvalues.pdf.

International Search Report and Written Opinion dated Aug. 5, 2020 in International Patent Application No. PCT/US2020/028071, 9 pages.

TW Office Action dated May 27, 2022 for Application No. 110142701.

TW Office Action dated Sep. 13, 2022, Application No. 110142701.

KR Office Action dated Jan. 2, 2023 for Application 10-2021-0156526. (with Translation).

\* cited by examiner

TREATMENTS TO ENHANCE MATERIAL STRUCTURES

CROSS-REFERENCE TO RELATED APPLICATIONS

This application is a continuation application of U.S. patent application Ser. No. 16/951,858, filed Nov. 18, 2020, which is a continuation-in-part application of U.S. patent application Ser. No. 16/403,312, filed on May 3, 2019, both of which are incorporated herein by reference.

BACKGROUND

Field

Embodiments described herein generally relate to semiconductor device fabrication, and more particularly, to systems and methods of forming a high quality high-κ dielectric material layer and a metal gate structure in a semiconductor structure.

Description of the Related Art

As metal-oxide-semiconductor field-effect transistors (MOSFETs) have decreased in size to achieve high device performance and low power consumption, the thickness of a traditional silicon dioxide ($SiO_2$) gate dielectric has decreased to its physical limit. As a result, replacing the silicon dioxide gate dielectric with a high-κ dielectric material has been inevitable to achieve further scaling. Among various high-κ dielectric materials, hafnium oxide ($HfO_2$) has been applied since the 45 nm MOSFET technology node due to its high dielectric constant and superior thermal stability on a silicon substrate. However, for further scaling of equivalent oxide thickness (EOT) for the 32 nm MOSFET technology node and beyond, simply decreasing the thickness of a high-κ dielectric material layer is problematic due to an increase of leakage current through the high-κ dielectric material layer.

In addition, conventional polycrystalline silicon (polysilicon) gates have been replaced by metal gates formed of a metal layer (e.g., titanium (Ti), tantalum (Ta), tungsten (W)) and a metal-containing conductive compound layer (e.g., titanium nitride (TiN), tantalum nitride (TaN)) to reduce undesired voltage drops associated with the polysilicon depletion effect, as well as increase drive current performance and the operational speed of MOSFETs. However, such metal gates are typically formed by a furnace-based process using a metal-containing precursor (e.g., titanium chloride, $TiCl_4$) and a nitrogen-containing precursor (e.g., ammonia, $NH_3$). This process may include high oxygen content and therefore may not be ideal for future scalability.

Thus, there is a need for systems and methods that can be used to form thin (e.g., EOT less than 1 nm) high-κ dielectric material layers having chemical structures that can be controlled to ensure desired structural and electrical properties, and to form metal gates without high oxygen content.

SUMMARY

Embodiments of the present disclosure provide a method of forming a high-κ dielectric cap layer on a semiconductor structure formed on a substrate. The method includes depositing the high-κ dielectric cap layer on the semiconductor structure, depositing a sacrificial silicon cap layer on the high-κ dielectric cap layer, performing a post cap anneal process to harden and densify the as-deposited high-κ dielectric cap layer, and removing the sacrificial silicon cap layer.

Embodiments of the present disclosure also provide a method of forming a high-κ dielectric cap layer on a semiconductor structure formed on a substrate. The method includes depositing the high-κ dielectric cap layer on the semiconductor structure, depositing a sacrificial silicon cap layer on the high-κ dielectric cap layer, performing a post cap anneal process to harden and densify the as-deposited high-κ dielectric cap layer, and removing the sacrificial silicon cap layer.

Embodiments of the present disclosure further provide a processing system. The system includes a first processing chamber, a second processing chamber, a third processing chamber, a fourth processing chamber, and a system controller. The system controller is configured to deposit a high-κ dielectric cap layer on the high-κ gate dielectric layer in the sixth processing chamber, deposit a sacrificial silicon cap layer on the high-κ dielectric cap layer in the seventh processing chamber, perform a post cap anneal process to harden and densify the as-deposited high-κ dielectric cap layer in the eighth processing chamber, and remove the sacrificial silicon cap layer in the ninth processing chamber. The substrate is transferred among the first, second, third, and fourth processing chambers without breaking vacuum environment in the processing system.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

As gate structures scale to smaller dimensions, new material structures are being sought to provide improvements. The use of high-κ dielectric materials increases the dielectric constant of the gate structure over conventional gate structures that utilize materials such as silicon oxide. However, similar to silicon oxide, as the thickness of a gate structure is reduced, leakage currents increase. For example, gate leakage increases as the effective oxide thickness decreases. Hence, the inverse relationship between gate leakage and effective oxide thickness may form a limit on the performance of the transistor and the device produced.

High-κ dielectric materials may provide greater electrostatic control on channel over silicon oxide at similar physical thicknesses. As the industry continues to seek lower effective oxide thicknesses without increased gate leakage, efforts to maximize a dielectric constant (also referred to as "κ-value") of known high-κ materials are reaching limits due to morphological characteristics. Conventional technologies have struggled to overcome natural characteristics of high-κ materials, which may set an upper limit in the κ-value, and subsequent device remodeling in attempts to incorporate new films.

In addition, a typical furnace-based process of metal gates formed of a metal layer and a metal-containing conductive compound, which replace polycrystalline silicon (polysilicon) gates may include high oxygen content during the process and therefore may not be ideal for future scalability.

The embodiments described herein provide systems and methods for forming thin (e.g., EOT less than 1 nm) high-κ dielectric material layers, and forming metal gates. By producing high-κ dielectric materials exhibiting a specific morphology or a grain structure, higher dielectric constants and subsequent improved device performance may be enabled. In order to control the in-film morphology in exemplary devices, treatments may be performed to provide activated substrate surfaces that can induce a specific film morphology, as well as to stabilize films after formation, which may result in a higher dielectric constant. Forming metal gates without high oxygen content allows further scaling of equivalent oxide thickness (EOT).

Figure 1:
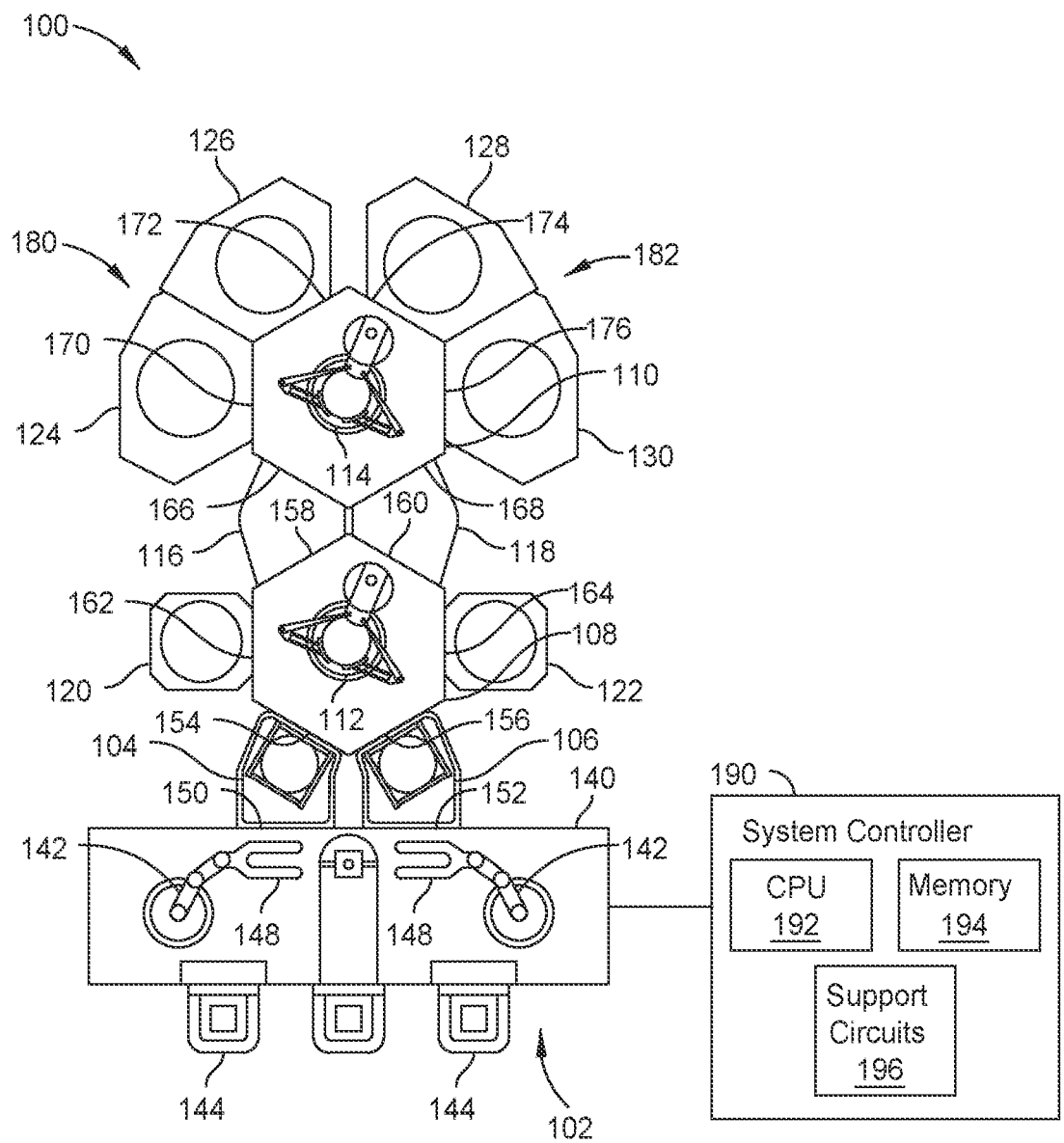
FIG. 1 is a schematic top-view diagram of an example multi-chamber processing system according to one embodiment.

FIG. 1 is a schematic top-view diagram of an example of a multi-chamber processing system 100 according to some examples of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, wafers in the processing system 100 can be processed in and transferred between the various chambers without exposing the wafers to an ambient environment exterior to the processing system 100 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 100. Accordingly, the processing system 100 may provide for an integrated solution for some processing of wafers.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 140 and factory interface robots 142 to facilitate transfer of wafers. The docking station 140 is configured to accept one or more front opening unified pods (FOUPs) 144. In some examples, each factory interface robot 142 generally comprises a blade 148 disposed on one end of the respective factory interface robot 142 configured to transfer the wafers from the factory interface 102 to the load lock chambers 104, 106.

The load lock chambers 104, 106 have respective ports 150, 152 coupled to the factory interface 102 and respective ports 154, 156 coupled to the transfer chamber 108. The transfer chamber 108 further has respective ports 158, 160 coupled to the holding chambers 116, 118 and respective ports 162, 164 coupled to processing chambers 120, 122. Similarly, the transfer chamber 110 has respective ports 166, 168 coupled to the holding chambers 116, 118 and respective ports 170, 172, 174, 176 coupled to processing chambers 124, 126, 128, 130. The ports 154, 156, 158, 160, 162, 164, 166, 168, 170, 172, 174, 176 can be, for example, slit valve openings with slit valves for passing wafers therethrough by the transfer robots 112, 114 and for providing a seal between respective chambers to prevent a gas from passing between the respective chambers. Generally, any port is open for transferring a wafer therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 142 transfers a wafer from a FOUP 144 through a port 150 or 152 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the wafer between, for example, the atmospheric environment of the factory interface 102 and the low pressure or vacuum environment of the transfer chamber 108.

With the wafer in the load lock chamber 104 or 106 that has been pumped down, the transfer robot 112 transfers the wafer from the load lock chamber 104 or 106 into the transfer chamber 108 through the port 154 or 156. The transfer robot 112 is then capable of transferring the wafer to and/or between any of the processing chambers 120, 122 through the respective ports 162, 164 for processing and the holding chambers 116, 118 through the respective ports 158, 160 for holding to await further transfer. Similarly, the transfer robot 114 is capable of accessing the wafer in the holding chamber 116 or 118 through the port 166 or 168 and is capable of transferring the wafer to and/or between any of the processing chambers 124, 126, 128, 130 through the respective ports 170, 172, 174, 176 for processing and the holding chambers 116, 118 through the respective ports 166, 168 for holding to await further transfer. The transfer and holding of the wafer within and among the various chambers can be in the low pressure or vacuum environment provided by the gas and pressure control system.

The processing chambers 120, 122, 124, 126, 128, 130 can be any appropriate chamber for processing a wafer. In some examples, the processing chamber 122 can be capable of performing a cleaning process, the processing chamber 120 can be capable of performing an etch process, and the processing chambers 124, 126, 128, 130 can be capable of performing respective epitaxial growth processes. The processing chamber 122 may be a SiCoNi™ Preclean chamber available from Applied Materials of Santa Clara, Calif. The processing chamber 120 may be a Selectra™ Etch chamber available from Applied Materials of Santa Clara, Calif.

A system controller 190 is coupled to the processing system 100 for controlling the processing system 100 or components thereof. For example, the system controller 190 may control the operation of the processing system 100 using a direct control of the chambers 104, 106, 108, 116, 118, 110, 120, 122, 124, 126, 128, 130 of the processing system 100 or by controlling controllers associated with the chambers 104, 106, 108, 116, 118, 110, 120, 122, 124, 126, 128, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general purpose processor that can be used in an industrial setting. The memory 194, or non-transitory computer-readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular process chamber) as, for example, a software routine. When the computer instruction code is executed by the CPU 192, the CPU 192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2:
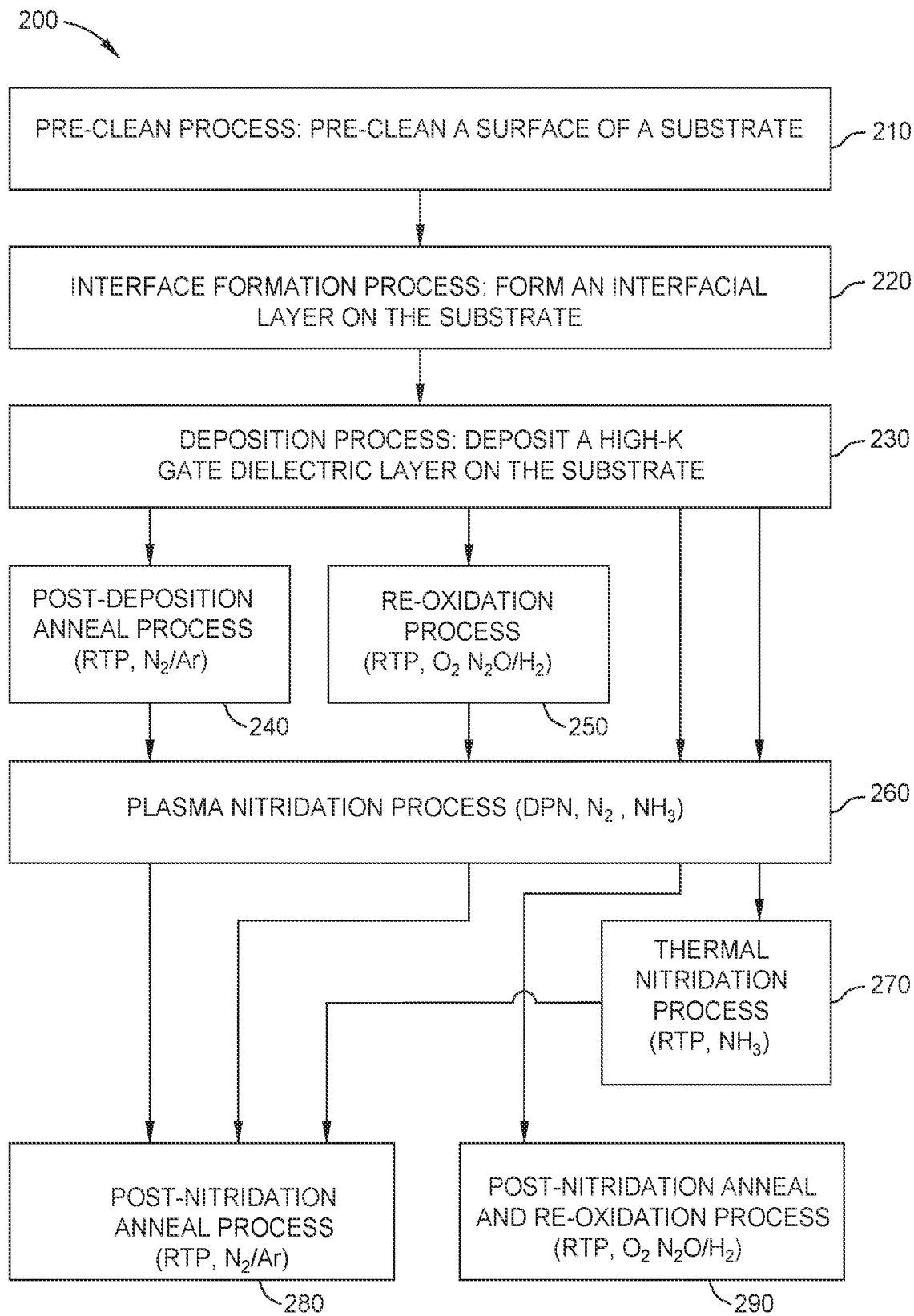
FIG. 2 is a process flow diagram of a method of forming a semiconductor structure according to one embodiment.
Figure 3A:
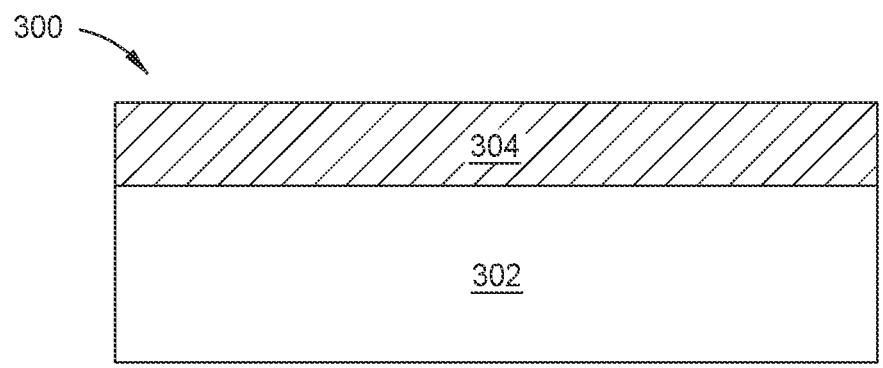
FIGS. 3A and 3B are schematic views of a semiconductor structure according to one embodiment.
Figure 3B:
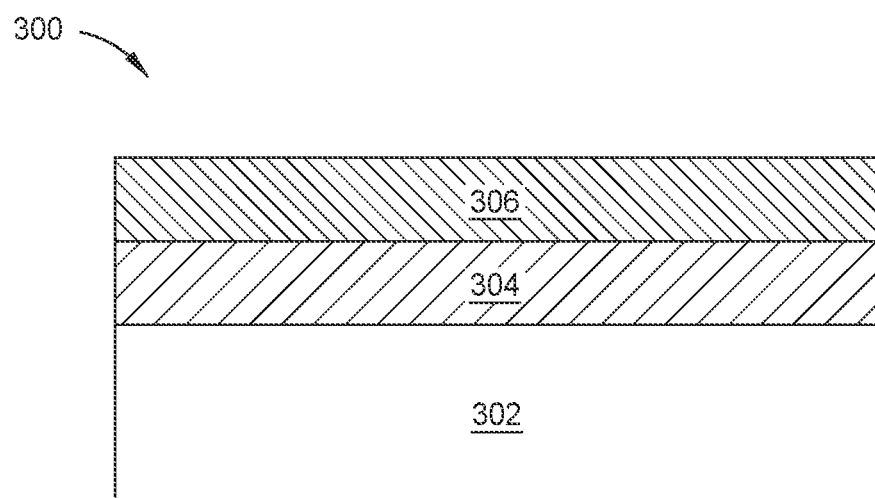

FIG. 2 is a process flow diagram of a method 200 of forming a semiconductor structure 300 according to one or more implementations of the present disclosure. FIGS. 3A and 3B are cross-sectional views of a portion of the semiconductor structure 300 corresponding to various states of the method 200. It should be understood that FIGS. 3A and 3B illustrate only partial schematic views of the semiconductor structure 300, and the semiconductor structure 300 may contain any number of transistor sections and additional materials having aspects as illustrated in the figures. It should also be noted although the method steps illustrated in FIG. 2 are described sequentially, other process sequences that include one or more method steps that have been omitted and/or added, and/or has been rearranged in another desirable order, fall within the scope of the embodiments of the disclosure provided herein.

The method 200 begins with a pre-clean process in block 210 to pre-clean a surface of the substrate 302. The pre-clean process may include etching the surface of the substrate 302 by a wet etch process using an etch solution, such as a Standard Clean 1 (SC1) etch solution including $NH_4OH$ (ammonium hydroxide), $H_2O_2$ (hydrogen peroxide), and $H_2O$ (water), or a dry etch process, for example, a SiConi™ remote plasma assisted dry etch process, in which the surface of the substrate 302 is exposed to $N_2$, $NF_3$, and $NH_3$ plasma by-products. The pre-clean process may be performed in a pre-clean chamber, such as the processing chamber 122 or 120 shown in FIG. 1.

In block 220, an interface formation process is performed to form an interfacial layer 304 on the pre-cleaned surface of the substrate 302, as shown in FIG. 3A. The interface formation process may include a suitable thermal oxidation process, such as an enhanced in-situ steam generation (eISSG) process utilizing nitrous oxide ($N_2O$) gas. The interfacial layer 304 formed in block 220 is a thin amorphous silicon oxide ($SiO_2$) layer, having a thickness of between about 3 Å and about 10 Å, for example, about 5 Å, corresponding to one or more monolayers of silicon oxide. In some embodiments, the interfacial layer 304 may be formed by an in-situ steam generation (ISSG) process utilizing $H_2$ and $O_2$ gases, or a rapid thermal oxidation (RTO) process utilizing $NH_3$ and $O_2$ gases. The interfacial layer 304 may act as a nucleation layer of a high-κ dielectric material layer to be deposited thereon and improve quality (e.g., such as interface state density, accumulation capacitance, frequency dispersion, and leakage current) of the interface between the substrate 302 and the high-κ dielectric material layer. The interface formation process may be performed in a processing chamber, such as the processing chamber 120, 122, 124, 126, 128, or 130 shown in FIG. 1.

In some embodiments, the interface formation process in block 220 is omitted and the interfacial layer 304 is not formed prior to deposition of a high-κ dielectric material layer on the substrate 302. In that case, the interfacial layer 304 is formed by a thermal oxidation process in block 250 or block 290, described below, that thermally oxidizes the substrate 302 through a high-κ dielectric material layer deposited on the substrate 302. The interfacial layer 304 formed by the thermal oxidation process in block 250 or block 290 may be thick enough to ensure reliable device characteristics (e.g., such as interface state density, accumulation capacitance, frequency dispersion, and leakage current) and reduce atomic diffusion from the high-κ dielectric material layer to the substrate 302, having a thickness of between about 0.3 nm and about 1 nm, for example, about 0.5 nm.

In block 230, a deposition process is performed to deposit a high-κ gate dielectric layer 306 on the exposed surface of the semiconductor structure 300 (i.e., the interfacial layer 304, as shown in FIG. 3B, if the interfacial layer 304 is formed in block 220, and the substrate 302 if the interfacial layer 304 is not formed in block 220). The high-κ gate dielectric layer 306 may be formed of high-κ dielectric material, such as hafnium dioxide ($HfO_2$), zirconium dioxide ($ZrO_2$), ytterbium oxide ($Y_2O_3$), aluminum oxide ($Al_2O_3$), ternary high-κ dielectric film with the third element doped into the existing metal oxide high-κ dielectric host material, such as HfZrO, HfLaOx, HfTiO. The deposition process may include an atomic layer deposition (ALD) process, in which a metal-containing precursor and an oxygen-containing precursor are alternately delivered to the exposed surface of the semiconductor structure 300. In some embodiments, the metal-containing precursor is purged prior to delivering the oxygen-containing precursor. The metal may be a transition metal, such as hafnium (Hf), zirconium (Zr), or titanium (Ti), a rare-earth metal, such as lanthanum (La), ytterbium (Yb), or yttrium (Y), an alkaline earth metal, such as strontium (Sr), or other metal such as aluminum (Al). For the oxidant, any oxygen-containing precursor may be used that may react with the metal. For example, the oxygen-containing precursor may be or include water, diatomic oxygen, ozone, a hydroxyl-containing precursor or alcohol, nitrogen-and-oxygen-containing precursors, plasma-enhanced oxygen including locally or remotely enhanced oxygen, or any other material including oxygen that may be incorporated with the metal to produce a layer of an oxide of the metal over the substrate 302. In one example, the metal-containing precursor is hafnium tetrachloride ($HfCl_4$) and the oxidant is water ($H_2O$) to form a hafnium dioxide ($HfO_2$) layer. The ALD process may be performed at a temperature of between 200° C. and about 400° C., for example, about 270° C. The high-κ gate dielectric layer 306, as deposited by the ALD process, may be amorphous and have a thickness of between about 10 Å and about 30 Å. The deposition process may be performed in a processing chamber, such as the processing chamber 120, 122, 124, 126, 128, or 130 shown in FIG. 1.

In block 240, an optional post-deposition anneal process is performed to harden and densify the as-deposited high-κ gate dielectric layer 306. Crystallization of the as-deposited amorphous high-κ gate dielectric layer 306 may occur. The post-deposition anneal process may include a thermal anneal process in an inert ambient, such as in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The post deposition anneal process may thermally harden and densify the interfacial layer 304 and the high-κ dielectric layer 306.

The post deposition anneal process may be performed for between about 1 seconds and about 60 seconds, at a temperature of between about 500° C. and about 800° C., and at a pressure of between about 0.01 Torr and 100 Torr.

In block 250, alternative to the post-deposition anneal process in block 240, an optional re-oxidation process is performed to thermally oxidize the substrate 302. The re-oxidation process may include a thermal anneal process in an oxygen ($O_2$), nitrous oxide ($N_2O$), and $H_2$ ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The re-oxidation process in block 250 may thermally oxidize the underlying layer through the high-κ gate dielectric layer 306, and thus thicken the interfacial layer 304, if the interfacial layer 304 is formed in block 220, to a thickness of between about 3 Å and about 10 Å, and form an interfacial layer 304 in the substrate 302 near the interface with the high-κ dielectric layer 306, if an interfacial layer 304 is not formed in block 220.

The re-oxidation process may be performed for between about 1 seconds and about 30 seconds, at a temperature of between about 400° C. and about 900° C., and at a pressure of between about 0.01 Torr and 100 Torr.

In block 260, a plasma nitridation process is performed to insert nitrogen atoms into vacancies and defects in the high-κ gate dielectric layer 306. The plasma nitridation process may be a decoupled plasma nitridation (DPN) process performed in a DPN chamber such as CENTURA® DPN chamber, available from Applied Materials, Inc., located in Santa Clara, Calif. The DPN chamber may be any of the processing chambers 120, 122, 124, 126, 128, and 130 shown in FIG. 1. The plasma nitridation process exposes the high-κ gate dielectric layer 306 to nitrogen plasma, which may allow nitrogen radicals or nitrogen atoms to be incorporated within the high-κ gate dielectric layer 306, throughout the thickness of the high-κ gate dielectric layer 306. During the plasma nitridation process, nitrogen atoms may form metastable bonds with oxygen (O). Gases that may be used in the plasma process include nitrogen containing gas, such as nitrogen ($N_2$), ammonia ($NH_3$), or mixtures thereof. In one example, the nitrogen gas is ammonia ($NH_3$) mixed with about 3% to about 8% of nitrogen ($N_2$). The plasma nitridation process may not change the thickness of the high-κ gate dielectric layer 306 as a result of the nitrogen incorporation to vacancies and defects in the as-deposited high-κ gate dielectric layer 306.

The nitridation process may be performed for between about 10 seconds and about 300 seconds, at a temperature of between about 0° C. and about 500° C.

In block 270, an optional thermal nitridation process is performed to further insert nitrogen atoms into vacancies and defects in the plasma nitridated high-κ gate dielectric layer 306. The thermal nitridation process may include a thermal anneal process in an ammonia ($NH_3$) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1.

The thermal nitridation process may be performed for between about 10 seconds and about 300 seconds, at a temperature of between about 700° C. and about 900° C., and at a pressure of between about 10 Torr and 740 Torr.

In block 280, a post-nitridation anneal process is performed to passivate the remaining chemical bonds in the plasma nitridated high-κ gate dielectric layer 306. The post-nitridation anneal process may include a spike thermal anneal process in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The post-nitridation anneal process may passivate metastable nitrogen bonds formed in the plasma nitridation process in block 240 and crystallization of the amorphous high-κ gate dielectric layer 306 may occur.

The spike thermal anneal process may be performed for between about 1 seconds and about 30 seconds, at a temperature of between about 700° C. and about 850° C., and at a pressure of between about 10 Torr and 740 Torr.

In block 290, alternative to the post-nitridation anneal process in block 280, a post-nitridation anneal and re-oxidation process is performed to simultaneously passivate the remaining chemical bonds in the high-κ gate dielectric layer 306, as in block 280, and thermally oxidize the substrate 302, as in block 250. The post-nitridation anneal and re-oxidation process in block 290 is the same as the re-oxidation process in block 250. Thus, the details of the post-nitridation anneal and re-oxidation process in block 290 are omitted here.

Figure 4:
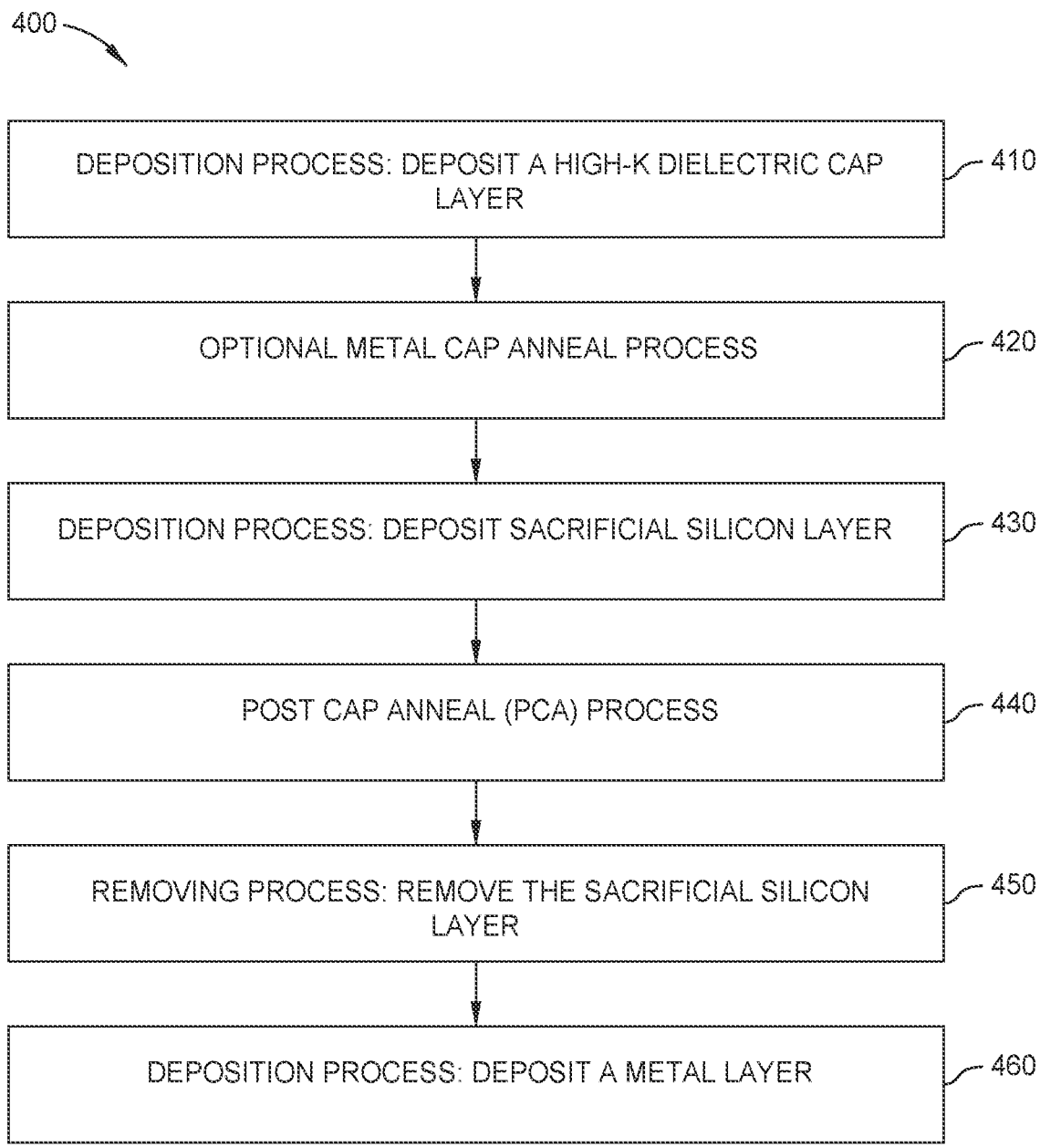
FIG. 4 is a process flow diagram of a method of forming a semiconductor structure according to one embodiment.
Figure 5A:
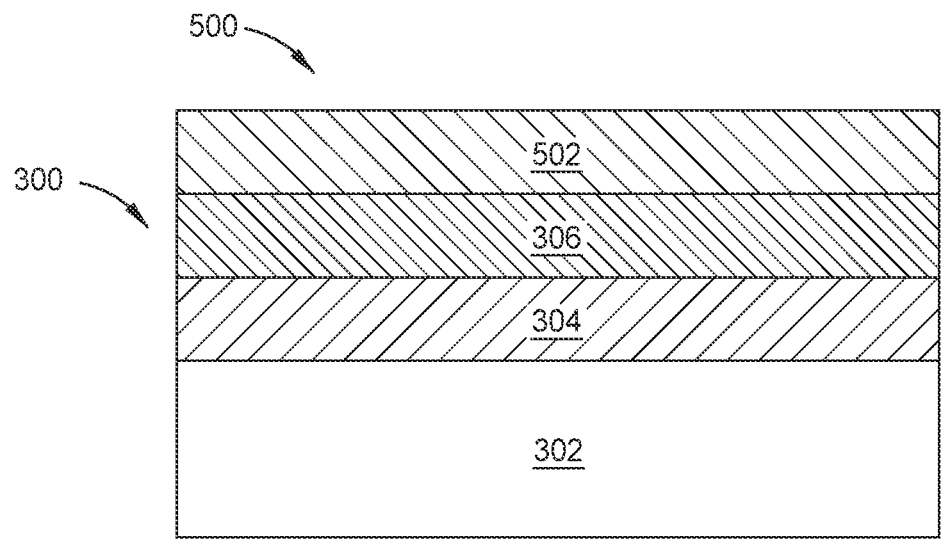
FIGS. 5A, 5B, and 5C are schematic views of a semiconductor structure according to one embodiment.
Figure 5B:
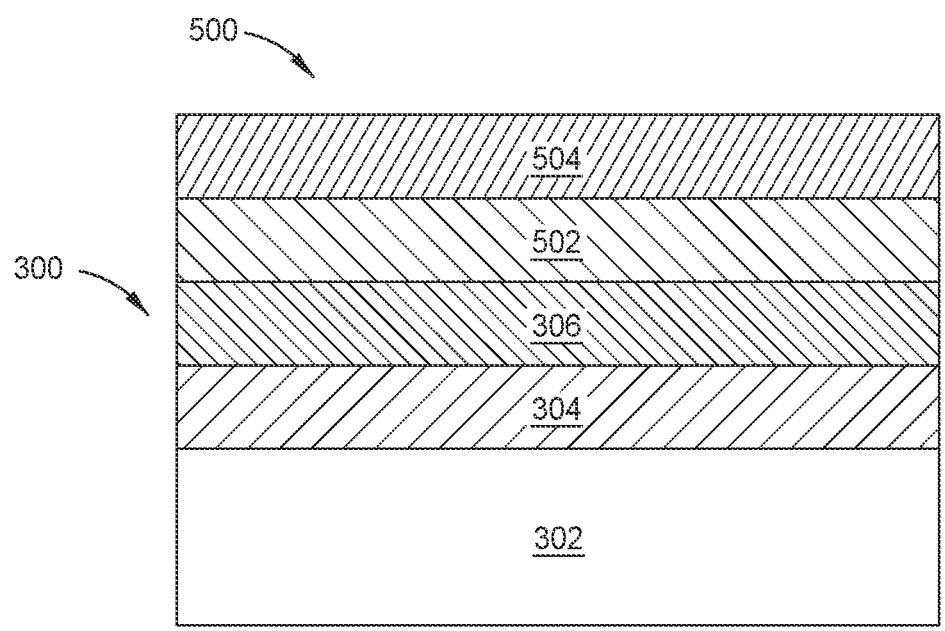
Figure 5C:
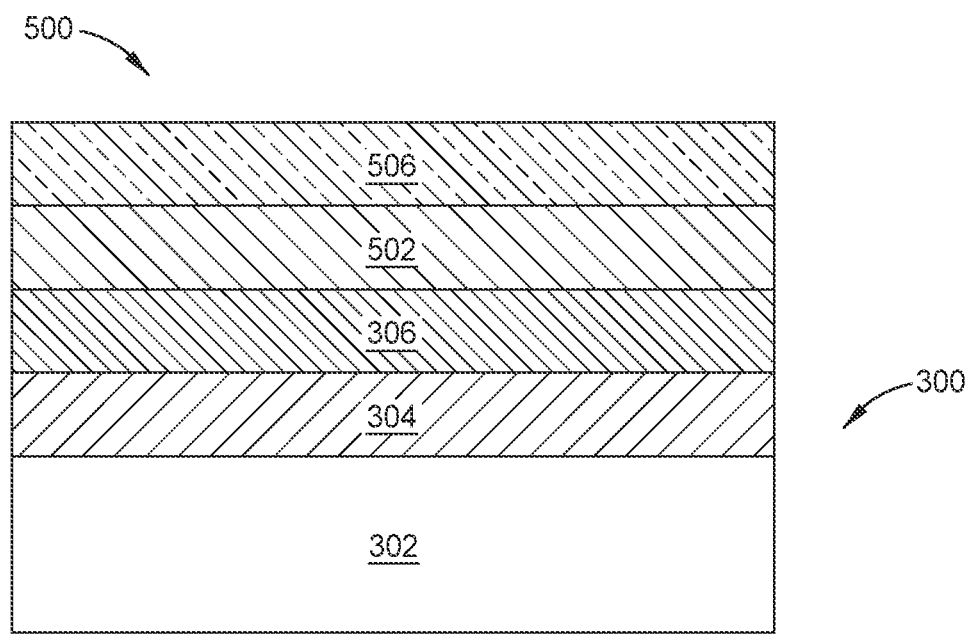

FIG. 4 is a process flow diagram of a method 400 of forming a metal gate structure 500 over the gate dielectric layer 306 in the semiconductor structure 300 according to one or more implementations of the present disclosure. FIGS. 5A, 5B, and 5C are cross-sectional views of a portion of the metal gate structure 500 in the semiconductor structure 300 corresponding to various states of the method 400. It should be understood that FIGS. 5A, 5B, and 5C illustrate only partial schematic views of the semiconductor structure 300, and the semiconductor structure 300 may contain any number of transistor sections and additional materials having aspects as illustrated in the figures. It should also be noted although the method steps illustrated in FIG. 4 are described sequentially, other process sequences that include one or more method steps that have been omitted and/or added, and/or has been rearranged in another desirable order, fall within the scope of the embodiments of the disclosure provided herein.

The method 400 begins with a deposition process in block 410 to deposit a high-κ dielectric cap layer 502 on the gate dielectric layer 306 of the semiconductor structure 300, as shown in FIG. 5A. The high-κ dielectric cap layer 502 may be formed of metal nitride material including titanium (Ti) or tantalum (Ta) doped with silicon (Si), aluminum (Al), gallium (Ga), germanium (Ge), indium (In), or hafnium (Hf), such as TiSiN, TaSiN, TiAlN, TaAlN, TiGaN, TaGaN, TiGeN, TaGeN, TiInN, TaInN, TiHfN or TaHfN. The high-κ dielectric cap layer 502 formed of such doped metal nitride material may be prevented from silicon (Si) migration during the subsequent silicon deposition process in block 430. The deposition process in block 410 may include an atomic layer deposition (ALD) process, in which the metal-containing precursor including titanium (Ti) or tantalum (Ta), the nitrogen-containing precursor, and a dopant-containing precursor are delivered to a surface of the gate dielectric layer 306. Examples of the metal-containing precursor including titanium (Ti) or tantalum (Ta), and examples of the nitrogen-containing precursor are listed in the description of block 420. The dopant-containing precursor includes aluminum (Al), gallium (Ga), germanium (Ge), hafnium (Hf), indium (In), or silicon (Si). Examples of the dopant-containing precursor including aluminum (Al) include inorganic compounds of aluminum (Al) such as aluminum chloride ($AlCl_3$) and aluminum bromide ($AlBr_3$), and organometallic compounds of aluminum (Al) such as trimethylaluminum (TMA, $(CH_3)_3Al$), dimethylaluminum hydride (DMAH, $(CH_3)_2AlH$), tris(diethylamino)aluminum (TDEAA, $Al(N(C_2H_5)_2)_3$), trimethylamine alane (TMAA, $AlH_3$—$N(CH_3)_3$), triethylamine alane (TEAA, $AlH_3$—N $(C_2H_5)_3$), dimethylethylamine alane ($AlH_3$—$C_2H_5$ $N(CH_3)_2$), triisobutylaluminum (TiBA, $[Al(CH_3)_2 CHCH_2]_3$), triethylaluminum (TEAI, $Al(C_2H_5)_3)_3$), dimethylaluminum hydride (DMAH, $(CH_3)_2AlH$), and diethylaluminum chloride (DEAC, $(C_2H_5)_2AlCl$). Examples of the dopant-containing precursor including gallium (Ga) include inorganic compounds of gallium (Ga) such as gallium tribromide ($GaBr_3$) and gallium trichloride ($GaCl_3$), and organometallic compounds of gallium (Ga) such as trimethyl gallium ($Ga(CH_3)_3$), triethylgallium ($Ga(C_2H_5)_3$), triisopropylgallium ($Ga(CH(CH_3)_2)_3$), tris(dimethylamido)gallium ($Ga(N(CH_3)_2)_3$), and tri-tert-butylgallium ($Ga(C(CH_3)_3)_3$). Examples of the dopant-containing precursor including germanium (Ge) include inorganic compounds of germanium (Ge) such as digermane ($Ge_2H_6$) and germane ($GeH_4$), and organometallic compounds of germanium (Ge) such as tetramethylgermanium ($(CH_3)_4Ge$). Examples of the dopant-containing precursor including hafnium (Hf) include inorganic compounds of hafnium (Hf) such as hafnium(IV) chloride ($HfCl_4$), and organometallic compounds of hafnium (Hf) such as hafnium(IV) tert-butoxide ($Hf[OC(CH_3)_3]_4$), tetrakis(diethylamido)hafnium(IV) ($[(CH_2CH_3)_2N]_4Hf$), tetrakis(dimethylamido)hafnium (IV) ($[(CH_3)_2N]_4Hf$), and tetrakis(ethylmethylamido)hafnium(IV) (TEMAH, $[(CH_3) (C_2H_5)N]_4Hf$). Examples of the dopant-containing precursor including indium (In) include inorganic compounds of indium (In) such as indium trichloride ($InCl_3$) and indium(I) iodide (InI), and organometallic compounds of indium (In) such as triethylindium ($In(CH_2CH_3)_3$) and indium (III) acetylacetonate ($In(OCCH_3CHOCCH_3)_3$). Examples of the dopant-containing precursor including silicon (Si) include inorganic compounds of silicon such as silane ($SiH_4$), disilane ($Si_2H_6$), and organometallic compounds of silicon (Si) such as trimethylsilane ($(CH_3)_3SiH$) and neopentasilane ($(SiH_3)_4Si$).

Sequences in which the metal-containing precursor, the nitrogen-containing precursor, and the dopant-containing precursor are delivered can be varied. In some embodiments, the metal-containing precursor, the nitrogen-containing precursor, and the dopant-containing precursor are alternately delivered. In some embodiments, the metal-containing precursor and the dopant-containing precursor are delivered simultaneously, and after purging, the nitrogen-containing precursor is delivered. TABLE 1 below shows several non-limiting sequence variants.

TABLE 1

Exemplary Deposition Sequences

| Options | Sequence |
| --- | --- |
| 1 | metal-containing precursor → purge → nitrogen-containing precursor → purge → dopant-containing precursor → purge → nitrogen-containing precursor → purge → repeat |
| 2 | dopant-containing precursor → purge → nitrogen-containing precursor → purge → metal-containing precursor → purge → nitrogen-containing precursor → purge → repeat |
| 3 | metal-containing precursor → purge → (nitrogen-containing precursor + dopant containing precursor) → purge → repeat |
| 4 | (metal-containing precursor + dopant-containing precursor) → purge → nitrogen-containing precursor → purge → repeat |
| 5 | metal-containing precursor → dopant-containing precursor → purge → nitrogen-containing precursor → purge → repeat |
| 6 | dopant-containing precursor → metal-containing precursor → purge → nitrogen-containing precursor → purge → repeat |

The ALD process in block 410 may be performed at a temperature of between about 200° C. and about 700° C., for example, between about 300° C. and about 600° C. The high-κ dielectric cap layer 502, as deposited by the ALD process in block 410, may be amorphous and have a thickness of between about 2 Å and about 200 Å, for example, between about 10 Å and about 15 Å. The deposition process may be performed in a processing chamber, such as the processing chamber 120, 122, 124, 126, 128, or 130 shown in FIG. 1.

In block 420, an optional metal cap anneal process is performed to harden and densify the as-deposited high-κ dielectric cap layer 502. Crystallization of the as-deposited high-κ dielectric cap layer 502 may occur. The optional metal cap anneal process in block 420 may include a thermal anneal process in an inert ambient, such as in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1.

The optional metal cap anneal process in block 420 may be performed for between about 1 second and about 10 seconds, at a temperature of between about 700° C. and about 850° C. and at a pressure of between about 0.1 Torr and 100 Torr.

In block 430, a deposition process is performed to deposit a sacrificial silicon cap layer 504 on the high-κ dielectric cap layer 502, as shown in FIG. 5B. The sacrificial silicon cap layer 504 may physically and chemically protect the underlying high-κ gate dielectric layer 306 and the high-κ dielectric cap layer 504 during the subsequent anneal process in block 440. The sacrificial silicon cap layer 504 is formed of amorphous silicon, such as hydrogenated amorphous silicon (a-Si:H). Amorphous silicon may provide less diffusion of atoms as compared to polycrystalline silicon which include grain boundaries leading path for diffusion. The deposition process in block 430 may be an atomic layer deposition (ALD) process or a chemical vapor deposition (CVD) process, in which the semiconductor structure 300 having the high-κ dielectric cap layer 502 formed thereon is exposed to a silicon precursor. Examples of the silicon precursors are poly-silanes ($Si_xH_y$). For example, poly-silanes include disilane ($Si_2H_6$), trisilane ($Si_3H_8$), tetrasilane ($Si_4H_{10}$), isotetrasilane, neopentasilane ($Si_5H_{12}$), cyclopentasilane ($Si_5H_{10}$), hexasilane ($C_6H_{14}$), cyclohexasilane ($Si_6H_{12}$) or, in general, $Si_xH_y$ with x=2 or more, and combinations thereof.

The sacrificial silicon cap layer 504 may have a thickness of between about 30 Å and about 50 Å. The deposition process in block 430 may be performed in a processing chamber, such as the processing chamber 120, 122, 124, 126, 128, or 130 shown in FIG. 1.

In block 440, a post cap anneal (PCA) process is performed to harden and densify the as-deposited high-κ dielectric cap layer 502. Crystallization of the as-deposited high-κ dielectric cap layer 502 and the as-deposited sacrificial silicon cap layer 504 may occur. The PCA process in block 440 may include a thermal anneal process in an inert ambient, such as in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1.

The PCA process in block 440 may be performed for between about 1 second and about 10 seconds, at a temperature of between about 900° C. and about 1000° C., for example, about 900° C. and at a pressure of between about 0.1 Torr and 100 Torr.

In block 450, a removing process is performed to strip the sacrificial silicon cap layer 504. The removing process may include a dry plasma etch process.

In block 460, a deposition process is performed to deposit a metal layer 506 on the hardened and densified high-κ dielectric cap layer 502, subsequent to the removing process in block 460, as shown in FIG. 5C. The metal layer 506 may be formed of tungsten (W), or cobalt (Co). The metal layer 506 may be p-type doped or n-type doped. The deposition process in block 480 may include a chemical vapor deposition (CVD) process using a tungsten-containing precursor, such as $WF_6$, or a cobalt-containing precursor.

The high-κ dielectric cap layer 502 formed of doped metal nitride material described herein may be effective as a fluorine barrier, for example, in a deposition process using a fluorine-containing precursor, such as $WF_6$, in block 460. The high-κ dielectric cap layer 502 formed of doped metal nitride material described herein may also prevent aluminum (Al) migration, and thus eliminate the need for an aluminum barrier, while a conventional high-κ dielectric cap layer formed of metal nitride material such as titanium nitride (TiN) allows aluminum migration. The high-κ dielectric cap layer 502 formed of doped metal nitride material described herein may also serve as a work function layer to increase an effective work function at an interface between the high-κ dielectric cap layer 502 and the metal layer 506.

In some embodiments, the deposition process to deposit the high-κ dielectric cap layer 502 in block 410 and the deposition process to deposit the sacrificial silicon cap layer 504 in block 430 are performed without breaking the low pressure or vacuum environment in a processing system such as the processing system 100. The processes without breaking the low pressure or vacuum environment may reduce contamination due to moisture introduced in atmospheric environment.

In some embodiments, the deposition process to deposit the high-κ dielectric cap layer 502 in block 410, the deposition process to deposit the sacrificial silicon cap layer 504 in block 430, and the post cap anneal (PCA) process in block 440 are performed without breaking the low pressure or vacuum environment in a processing system such as the processing system 100. The processes without breaking the low pressure or vacuum environment may reduce contamination due to moisture introduced in atmospheric environment and further prevent thickening the high-κ gate dielectric layer 306.

In the embodiments described herein, the systems and the methods of forming high-quality thin high-κ dielectric material layers and metal gate structures are provided. The properties of such high-κ dielectric material layers may be well controlled. For example, the nitridation processes in blocks 260 and 270 may be controlled to provide a nitrogen incorporation in the high-κ gate dielectric layer 306 of between about 3 atomic % and about 20 atomic %, to achieve a higher K-value than a higher nitrogen incorporation, and better structural stabilization than a lower nitrogen incorporation. The anneal processes in blocks 240, 270, 280, and 290 may also be controlled to provide grains in the high-κ gate dielectric layer 306 having a size larger than about 20 Å, to reduce leakage currents through the high-κ gate dielectric layer 306.

The metal gate structure described herein may exhibit reduced equivalent oxide thickness (EOT), reduced leakage current therethrough, and increased effective work function. The metal gate structure described herein may also exhibit aluminum (A) barrier properties, which allows a direct formation of aluminum layer on the metal gate structure. This metal gate structure can be advantageously used in any metal gate applications and/or any barrier applications in MOSFETs, dynamic random-access memory (DRAM), and flash memories.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a metal gate structure, the method comprising:
    forming a semiconductor structure formed on a substrate, comprising:
    forming an interfacial layer on the substrate;
    depositing a high-k gate dielectric layer on the interfacial layer;
    depositing a high-K dielectric cap layer on the semiconductor structure;
    performing a metal cap anneal process to harden and densify the high-K dielectric cap layer in a nitrogen ($N_2$) ambient;
    depositing a sacrificial silicon cap layer on and in contact with the high-K dielectric cap layer;
    performing a post cap anneal process layer in a nitrogen ($N_2$) ambient to harden and densify the deposited high-K dielectric cap layer and the sacrificial silicon cap layer;
    removing the sacrificial silicon cap layer; and
    depositing a metal layer.

2. The method of claim 1, wherein the forming of the high-K dielectric cap layer is performed in a processing system without breaking vacuum.

3. The method of claim 1, further comprising:
performing a passivation anneal process to passivate chemical bonds in the high-K dielectric cap layer.

4. The method of claim 1, wherein the high-K dielectric cap layer comprises TiSiN.

5. The method of claim 1, further comprising:
the performing a metal cap anneal process, prior to the depositing of the sacrificial silicon cap layer, to harden and densify the high-K dielectric cap layer in a nitrogen (N2) ambient at a temperature of between 700° C. and 850 C.

6. The method of claim 1, wherein the post cap anneal process comprises annealing the high-K dielectric cap layer at a temperature of between 900° C. and 1000° C.

7. A method of forming a metal gate structure, the method comprising:
forming a semiconductor structure formed on a substrate, comprising:
forming an interfacial layer on the substrate;
depositing a high-k gate dielectric layer on the interfacial layer;
depositing a high-K dielectric cap layer on the semiconductor structure;
performing a metal cap anneal process to harden and densify the high-K dielectric cap layer in a nitrogen (N$_2$) ambient;
depositing a sacrificial silicon cap layer on and in contact with the high-K dielectric cap layer;
performing a post cap anneal process in a nitrogen (N2) ambient at a temperature of between 900° C. and 1000° C. to harden and densify the high-K dielectric cap layer and the sacrificial silicon cap layer;
removing the sacrificial silicon cap layer; and
depositing a metal layer.

8. The method of claim 7, wherein the forming of the high-K dielectric cap layer is performed in a processing system without breaking vacuum.

9. The method of claim 7, further comprising:
the performing a metal cap anneal process, prior to the depositing of the sacrificial silicon cap layer, to harden and densify the high-K dielectric cap layer in a nitrogen (N2) ambient at a temperature of between 700° C. and 850 C.

10. The method of claim 7, wherein depositing the metal layer includes depositing, by a chemical vapor deposition process, tungsten or cobalt.

* * * * *